(12) United States Patent
Ng et al.

(10) Patent No.: US 10,090,390 B2
(45) Date of Patent: Oct. 2, 2018

(54) FINFET WITH TRENCH FIELD PLATE

(71) Applicant: Taiwan Semiconductor Manufacturing Company, Ltd., Hsinchu (TW)

(72) Inventors: Chun-Wai Ng, Hsinchu (TW); Hsueh-Liang Chou, Jhubei (TW); Po-Chih Su, New Taipei (TW); Ruey-Hsin Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/640,895

(22) Filed: Jul. 3, 2017

(65) Prior Publication Data

US 2017/0301762 A1    Oct. 19, 2017

Related U.S. Application Data

(60) Continuation of application No. 14/584,823, filed on Dec. 29, 2014, now Pat. No. 9,698,227, which is a division of application No. 13/546,738, filed on Jul. 11, 2012, now Pat. No. 8,921,934.

(51) Int. Cl.
| | |
|---|---|
| *H01L 29/40* | (2006.01) |
| *H01L 29/66* | (2006.01) |
| *H01L 29/78* | (2006.01) |
| *H01L 29/36* | (2006.01) |
| *H01L 29/06* | (2006.01) |

(52) U.S. Cl.
CPC ........ *H01L 29/401* (2013.01); *H01L 29/0684* (2013.01); *H01L 29/36* (2013.01); *H01L 29/404* (2013.01); *H01L 29/407* (2013.01); *H01L 29/66704* (2013.01); *H01L 29/7824* (2013.01); *H01L 29/7825* (2013.01); *H01L 29/7856* (2013.01)

(58) Field of Classification Search
CPC . H01L 29/401; H01L 29/0684; H01L 29/404; H01L 29/7824–29/7825
USPC ......... 438/283; 257/139, 330, 347, 315, 255
See application file for complete search history.

(56) References Cited

U.S. PATENT DOCUMENTS

| | | | |
|---|---|---|---|
| 7,667,268 B2 * | 2/2010 | Disney | H01L 29/0638 257/335 |
| 2002/0105025 A1 * | 8/2002 | Fujihira | H01L 29/0619 257/328 |
| 2003/0001198 A1 * | 1/2003 | Bromberger | H01L 29/0653 257/327 |
| 2003/0178670 A1 | 9/2003 | Fried et al. | |

(Continued)

FOREIGN PATENT DOCUMENTS

WO    2012015550    2/2012

*Primary Examiner* — Bo Fan
(74) *Attorney, Agent, or Firm* — Slater Matsil, LLP

(57) ABSTRACT

An integrated circuit device includes a pad layer having a body portion with a first doping type laterally adjacent to a drift region portion with a second doping type, a trench formed in the pad layer, the trench extending through an interface of the body portion and the drift region portion, a gate formed in the trench and over a top surface of the pad layer along the interface of the body portion and the drift region portion, an oxide formed in the trench on opposing sides of the gate, and a field plate embedded in the oxide on each of the opposing sides of the gate.

20 Claims, 9 Drawing Sheets

(56) References Cited

U.S. PATENT DOCUMENTS

| | | | |
|---|---|---|---|
| 2005/0082591 A1* | 4/2005 | Hirler | H01L 29/0619 |
| | | | 257/302 |
| 2007/0278568 A1* | 12/2007 | Williams | H01L 21/761 |
| | | | 257/335 |
| 2008/0038890 A1* | 2/2008 | Tucker | H01L 29/0623 |
| | | | 438/270 |
| 2010/0096697 A1 | 4/2010 | Su et al. | |
| 2010/0155773 A1 | 6/2010 | Parthasarathy et al. | |
| 2014/0346590 A1 | 11/2014 | Meiser et al. | |

* cited by examiner

FINFET WITH TRENCH FIELD PLATE

This application is a continuation of and claims the benefit of U.S. application Ser. No. 14/584,823, filed Dec. 29, 2014, entitled "FinFET with Trench Field Plate," which is a divisional of and claims the benefit of U.S. application Ser. No. 13/546,738, now U.S. Pat. No. 8,921,934, filed Jul. 11, 2012, entitled, "FinFET with Trench Field Plate," which applications are hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. FinFETs not only improve areal density, but also improve gate control of the channel.

The on-resistance of conventional FinFET device may be limited by a number of factors. These include, for example, the channel density and the doping concentration of the drift region.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, multiple gate field-effect transistor (MuGFET) and nanowire devices.

Figure 1:
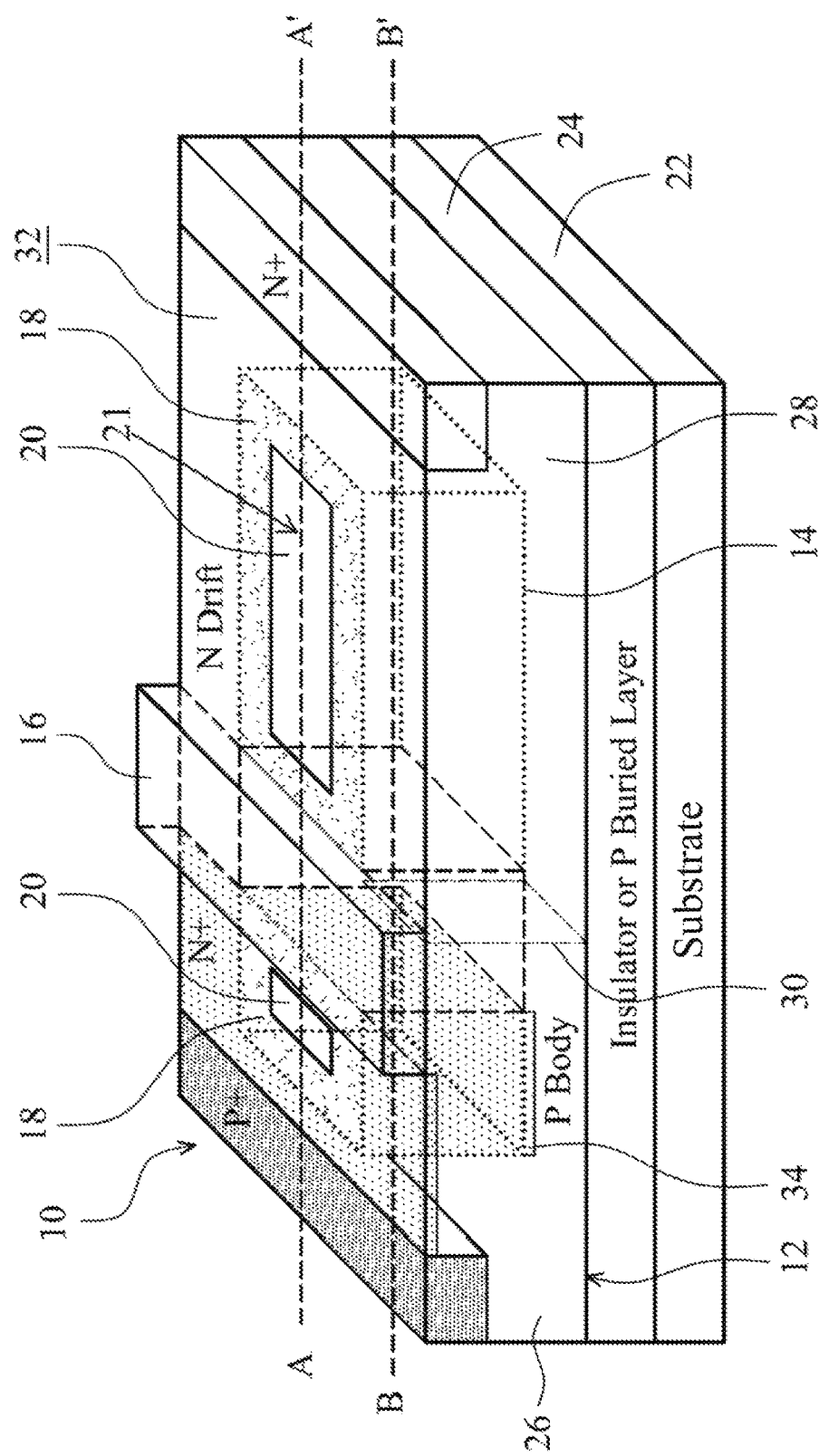
FIG. 1 is a perspective view of a representative portion of an embodiment FinFET device incorporating a trench field plate.
Figure 2:
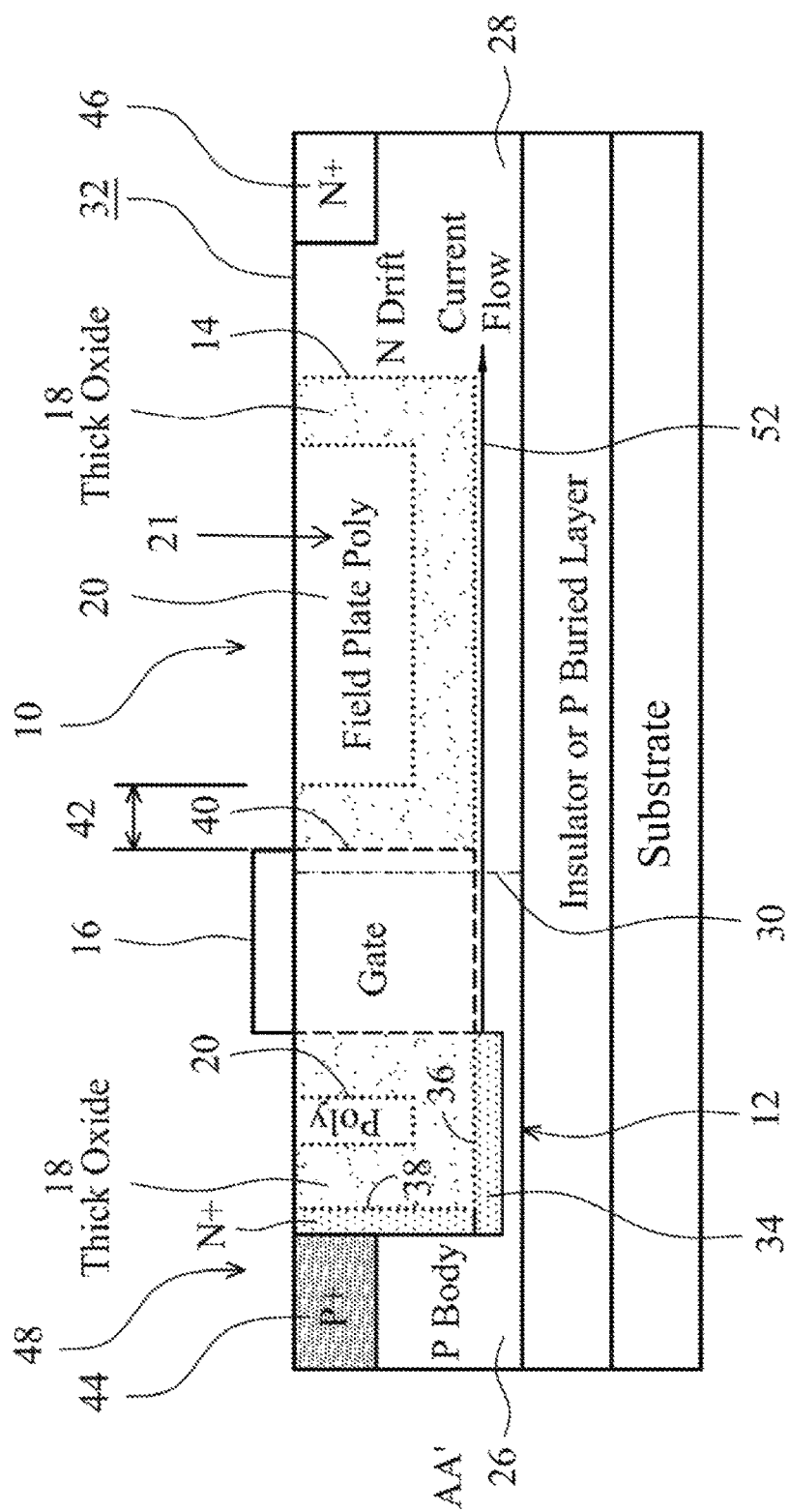
FIG. 2 is a cross section of the FinFET device of FIG. 1 taken generally along line A-A'.
Figure 3:
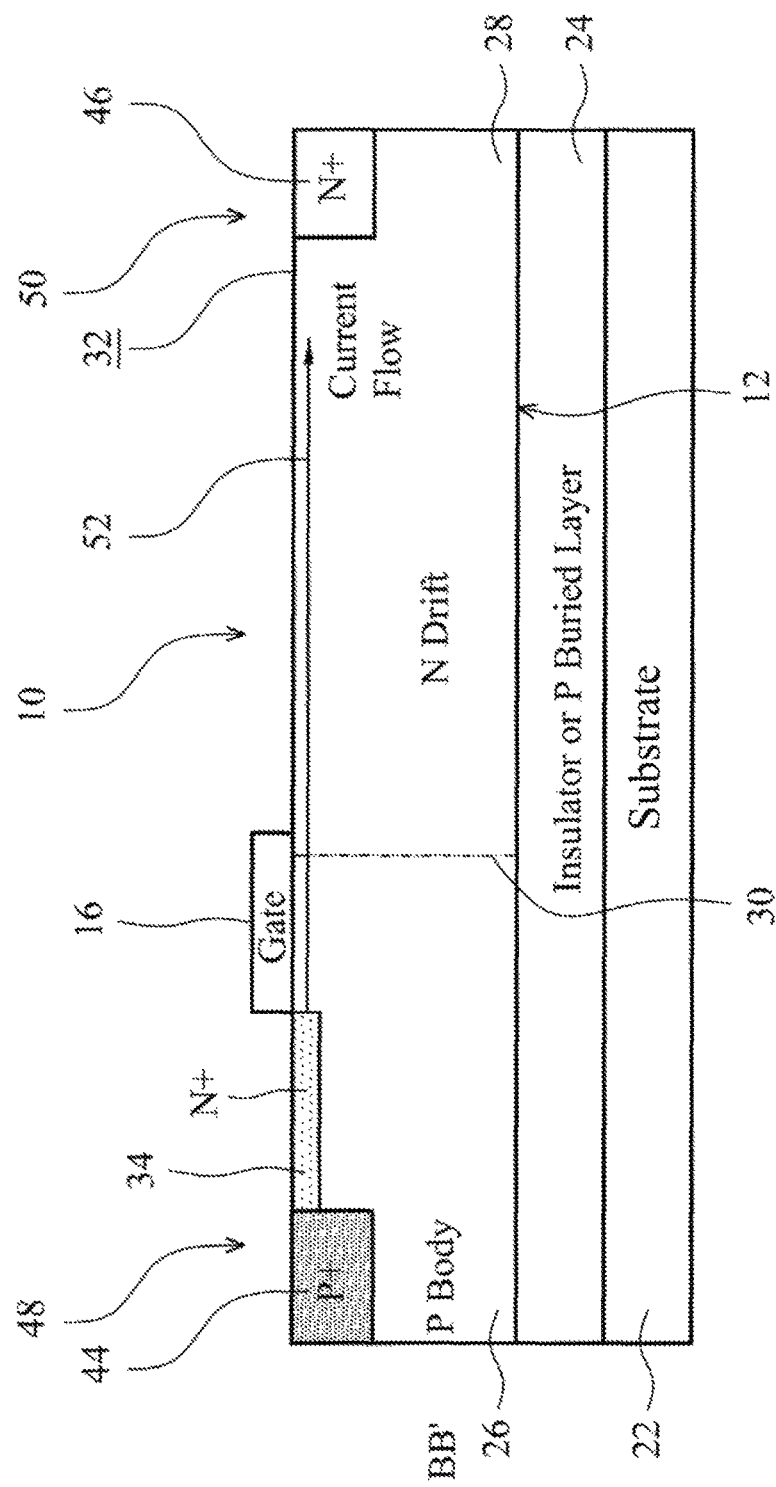
FIG. 3 is a cross section of the FinFET device of FIG. 1 taken generally along line B-B'.

Referring now to FIGS. 1-3, an embodiment FinFET device 10 is illustrated. As will be more fully explained below, the FinFET device 10 provides reduced channel and drift region resistances and reduced overall device specific on-resistance. In addition, the FinFET device 10 may be formed using a simplified process with a reduced mask count. As shown in FIGS. 1-3, the FinFET device 10 generally includes a pad layer 12, a trench 14, a gate 16, a dielectric material 18, and a field plate material 20 used to form a field plate 21.

As shown in FIGS. 1-3, the pad layer 12 is supported by a substrate 22 and a buried layer 24. In an embodiment, the substrate 22 is formed from a semiconductor material and the buried layer 24 is an insulator, a p-doped buried layer, or other suitable material. In an embodiment, the pad layer 12 is formed from n-type semiconductor material or implanted with n-type impurities. The pad layer 12 is generally divided into a p-doped body portion 26 laterally or horizontally adjacent to an n-doped drift region portion 28. The body portion 26 and the drift region portion 28, as well as other structures of the FinFET device 10, may be otherwise doped in different embodiments.

Still referring to FIGS. 1-3, the trench 14 is generally formed into the pad layer 12. In an embodiment, the trench 14 extends through an interface 30 of the body portion 26 and the drift region portion 28. In other words, the trench 14 is partially formed in both the body portion 26 and the drift region portion 28. In an embodiment, a longest dimension of the trench 14, which is the horizontal length of the trench 14 in FIG. 1, is orthogonal to the interface 30 of the body portion 26 and the drift region portion 28. In an embodiment, the trench 14 is formed using a masking and dry-etch process.

In an embodiment, the gate 16 is formed in the trench 14 and over a top surface 32 of the pad layer 12 along the interface 30 of the body portion 26 and the drift region portion 28. In an embodiment, the longest dimension of the trench 14, which is the horizontal length of the trench 14 in FIG. 1, is orthogonal to a longest dimension of the gate 16. In an embodiment, the gate 16 is formed from polysilicon and/or other suitable gate materials. As shown, a vertical height of the gate is greater than a depth of the trench 14. As such, the gate 16 protrudes above the top surface 32 of the pad layer 12. By using a three-dimensional gate 16 (a.k.a., a folded gate), the channel density of the FinFET device 10 is increased and the channel resistance is reduced.

As shown in FIGS. 1-3, in an embodiment a thin layer 34 of the body portion 26 of the pad layer 12 adjacent the gate 16 is heavily n-doped relative to n-doped drift region portion 28. The heavily n-doped thin layer 34 of the body portion 26 is generally disposed beneath a trench floor 36, behind trench sidewalls 38, and beneath the top surface 32 of the pad layer 12 adjacent the gate 16 as shown in FIG. 2. In an embodiment, the thin layer 34 is formed through an implantation process.

Still referring to FIGS. 1-3, the dielectric material 18 is formed in the trench 14 on opposing sides of the gate 16. The dielectric material 18 may be formed through, for example, deposition or a thermal oxidization process. In an embodiment, the dielectric material 18 is comprises an oxide layer. In an embodiment, the dielectric material 18 is formed on the trench sidewalls 36, the trench floor 38, and on gate sidewalls 40 as shown in FIG. 2. In an embodiment, the dielectric material 18 has a thickness 42 of between about one hundred Angstroms (100 A) and about ten micrometers (10 µm).

As shown in FIGS. 1-2, a field plate material 20 is embedded in the dielectric material on right hand side (i.e., drain side) of the gate 16 to form the field plate 21. In an embodiment, the same or similar field plate material 20 is embedded in the dielectric material 18 on the left hand side of the gate 16 as well. However, there is no field plate effect and, therefore, no field plate 21, on the left hand side/source side. In an embodiment, the field plate material 20 comprises polysilicon and/or other suitable materials having electrical conductivity. As shown, the field plate material 20 is formed in the trench 14 in separate and distinct segments on both sides of the gate 16. In an embodiment, top surfaces of the field plate material 20 and the dielectric material 18 are co-planar as shown in FIG. 2. By using the field plate 21, the drift region concentration is increased for the same breakdown voltage and the drift region resistance is reduced. By reducing both the channel resistance and the drift region resistance, the overall on-resistance of the FinFET device 10 is reduced.

Still referring to FIGS. 1-3, a highly p-doped region 44 is formed on one end of the FinFET device 10 and a highly n-doped region 46 is formed on the other. The highly p-doped region 44 functions as, functions as part of, a source 48 of the FinFET device 10. The highly n-doped region 46 functions as a drain 50 for the FinFET device 10.

As shown in FIGS. 1-3, the same trench 14 is used to form the source 48, the gate 16, and the field plate 21. Indeed, the size and shape of the trench 14 directly impacts the size and position of the source 48. In addition, in an embodiment the trench 14 generally contains or is filled by the field plate material 20, the dielectric material 18 and a portion of the gate 16.

Referring now to FIGS. 2-3, in an embodiment the trench 14 may be extended to the drain 50 to provide for uniform current flow 52 through the FinFET device 10. In addition, in an embodiment the breakdown voltage of the FinFET device 10 may be modified by adjusting a length of the field plate 21 and/or a length of the drift region portion 28.

Figure 4:
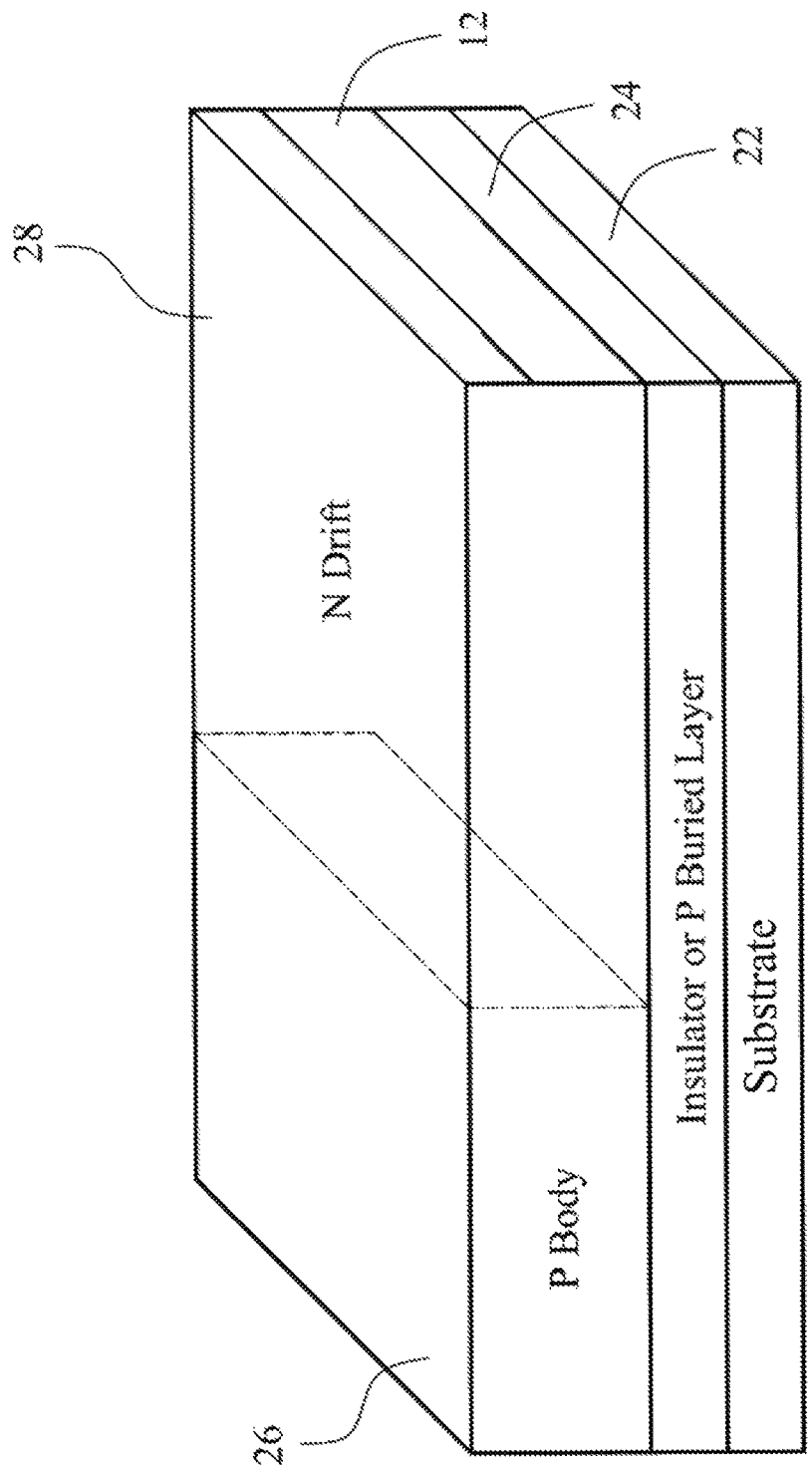
FIGS. 4-9 collectively schematically illustrate an embodiment method of forming the FinFET device of FIG. 1.

Referring to FIGS. 4-9, an embodiment method of forming the FinFET device 10 is collectively illustrated. Beginning with FIG. 4, the pad layer 12 is formed above the substrate 22 and the buried layer 24. Thereafter, a first masking process is employed to define an active region, which is the region of the pad layer 12 depicted in FIG. 4. In other words, the region outside of what is shown in FIG. 4 is covered by the mask. After the active region is defined, the pad layer 12 is oxidized and the body portion 26 of the pad layer 12 is subjected to a p-type implantation process to differentiate it from the n-doped drift region portion 28. In an embodiment, the pad layer 12 is formed from n-type semiconductor material.

Figure 5:
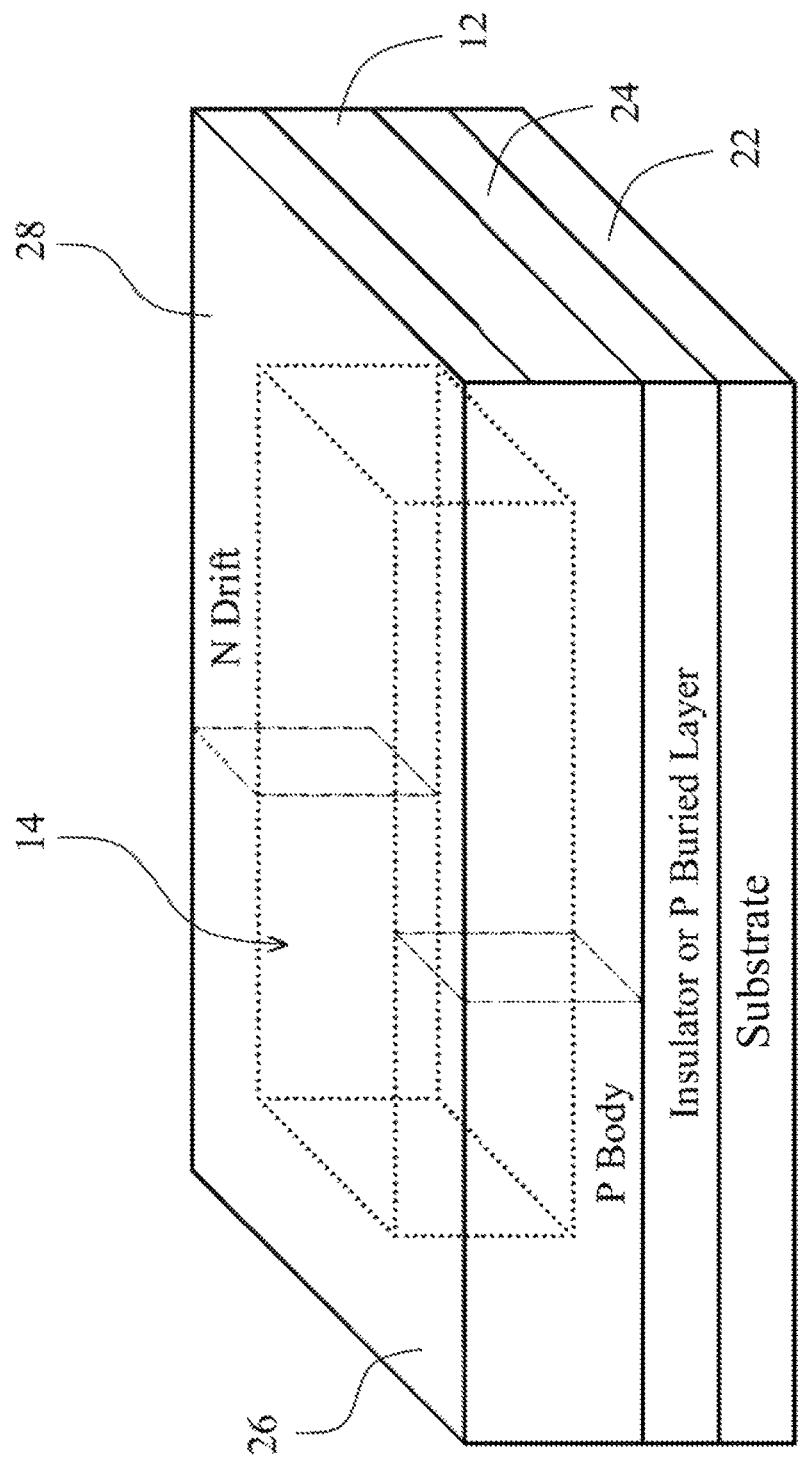
Figure 6:
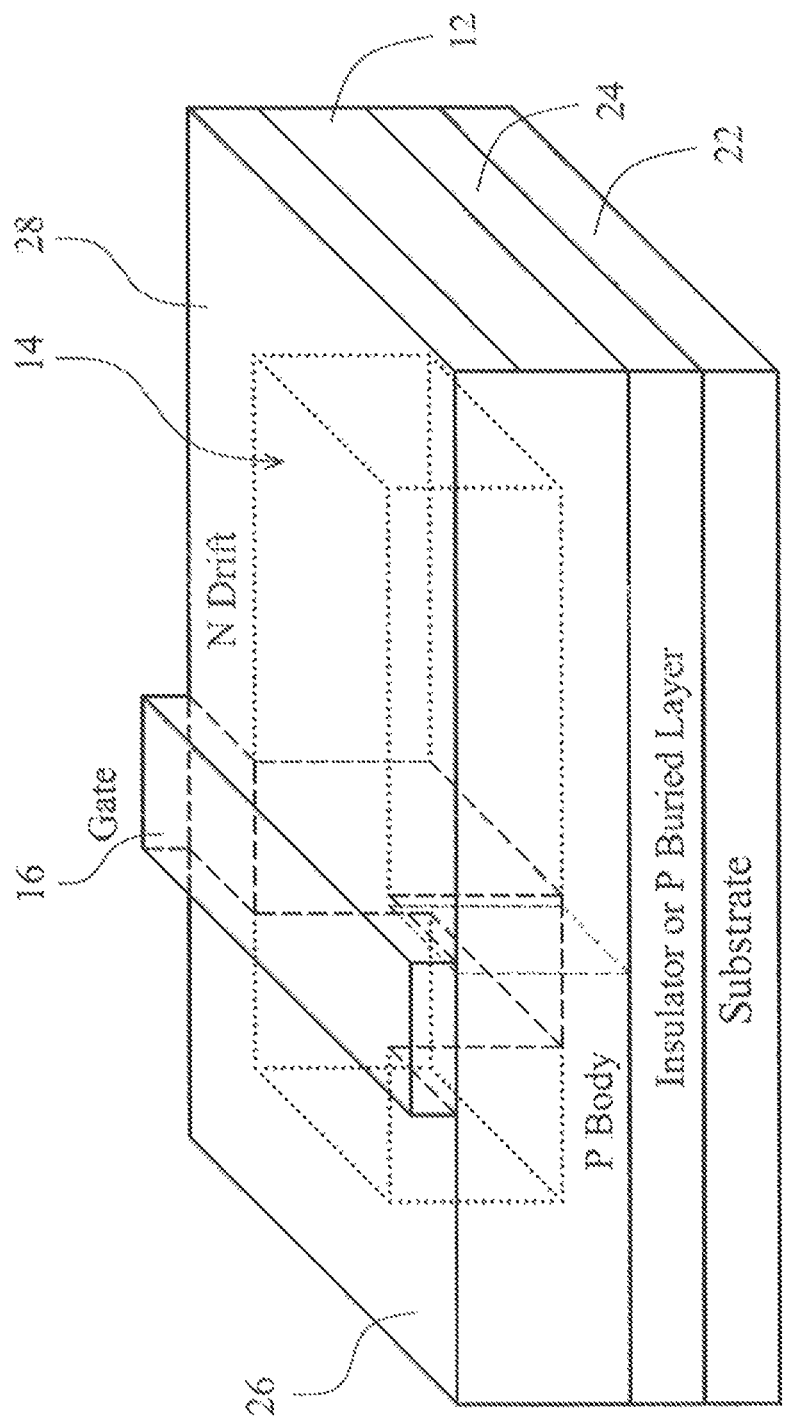

Next, as shown in FIG. 5, the trench 14 is formed. In an embodiment, the trench 14 is formed through a second masking and a dry etch process. However, the trench 14 may be otherwise formed in different embodiments. As shown, the trench 14 passes through the interface 30 and extends into both of the body portion 26 and the drift region portion 28. Thereafter, as shown in FIG. 6, a gate oxidation and a polysilicon deposition process are performed so that the gate 16 may be formed. The size and dimensions of the gate 16 are defined through a third masking and an etch process. Again, a dry etch or other suitable etch process may be implemented to form the gate 16.

Figure 7:
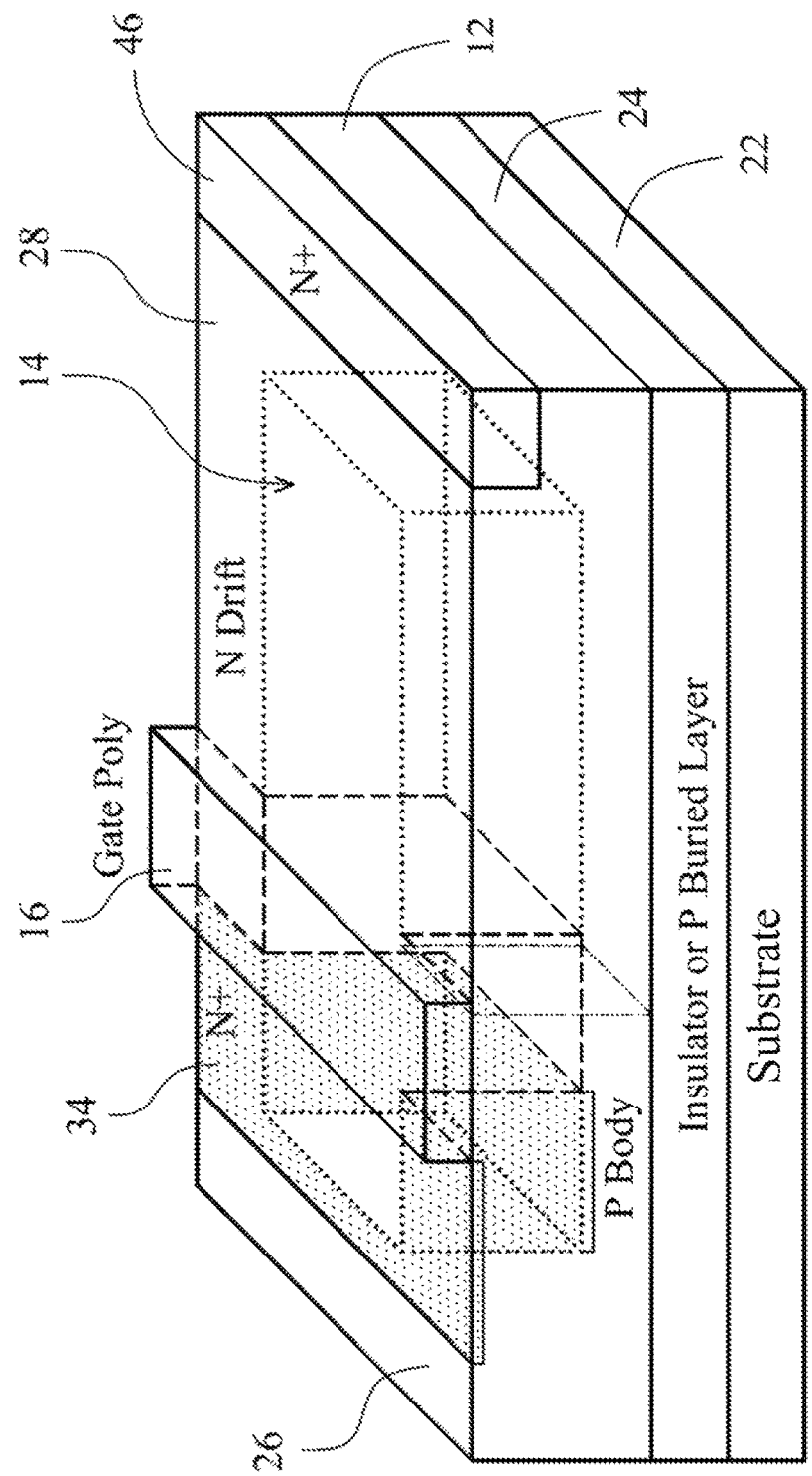
Figure 8:
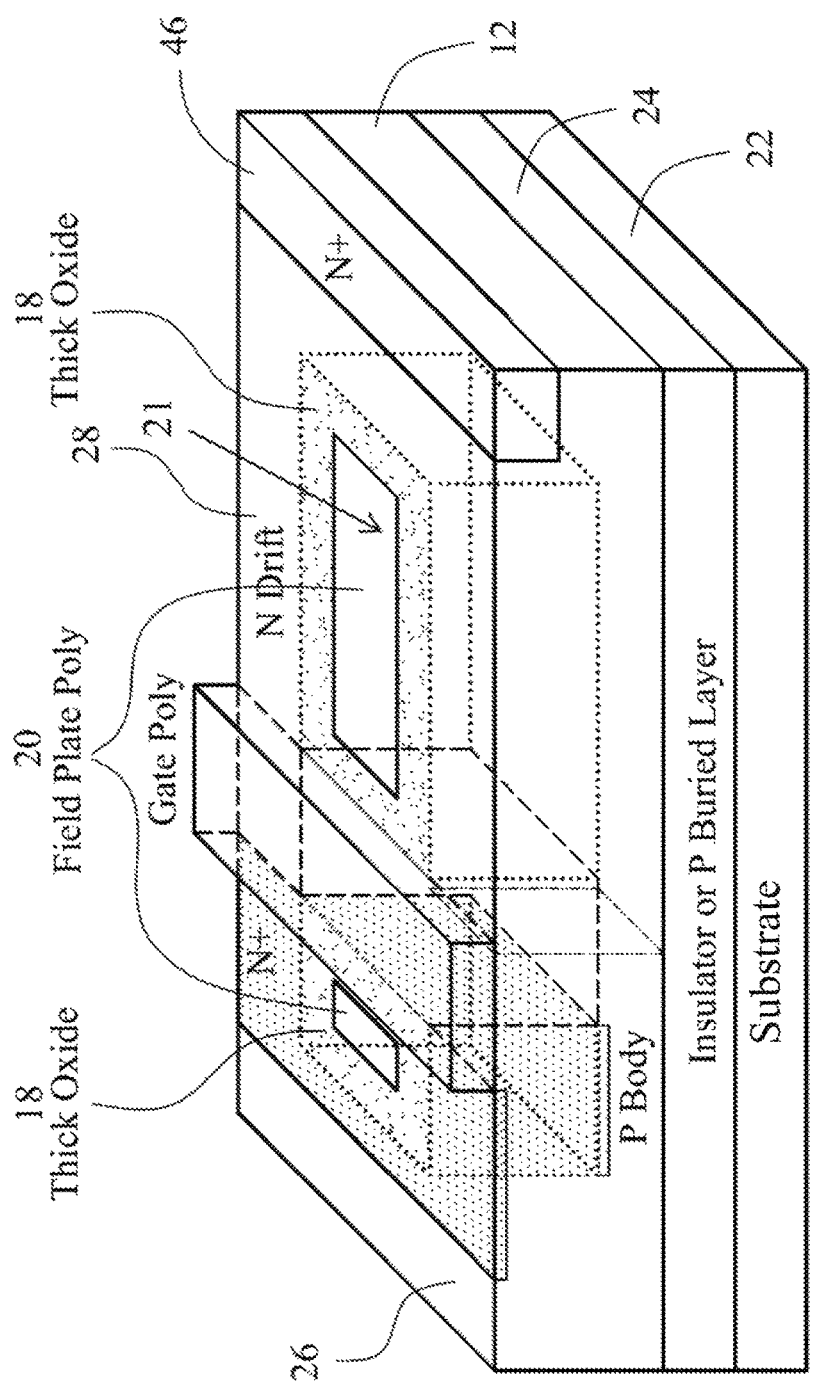

Moving to FIG. 7, a fourth masking is performed and the body portion 26 of the pad layer 12 adjacent the gate 16 is subjected to an n-type implantation process to generate the heavily n-doped thin layer 34 and the heavily-doped n+ region 46. Thereafter, as shown in FIG. 8, an oxide deposition process and a polysilicon deposition process are performed to deposit an oxide and then a polysilicon (not shown) over the entire structure. Once the oxide an polysilicon have been deposited, a fifth masking process, a polysilicon etch process, and an oxide etch process are performed to define the field plate 21, which is embedded in the dielectric material 18, as shown in FIG. 8.

Figure 9:
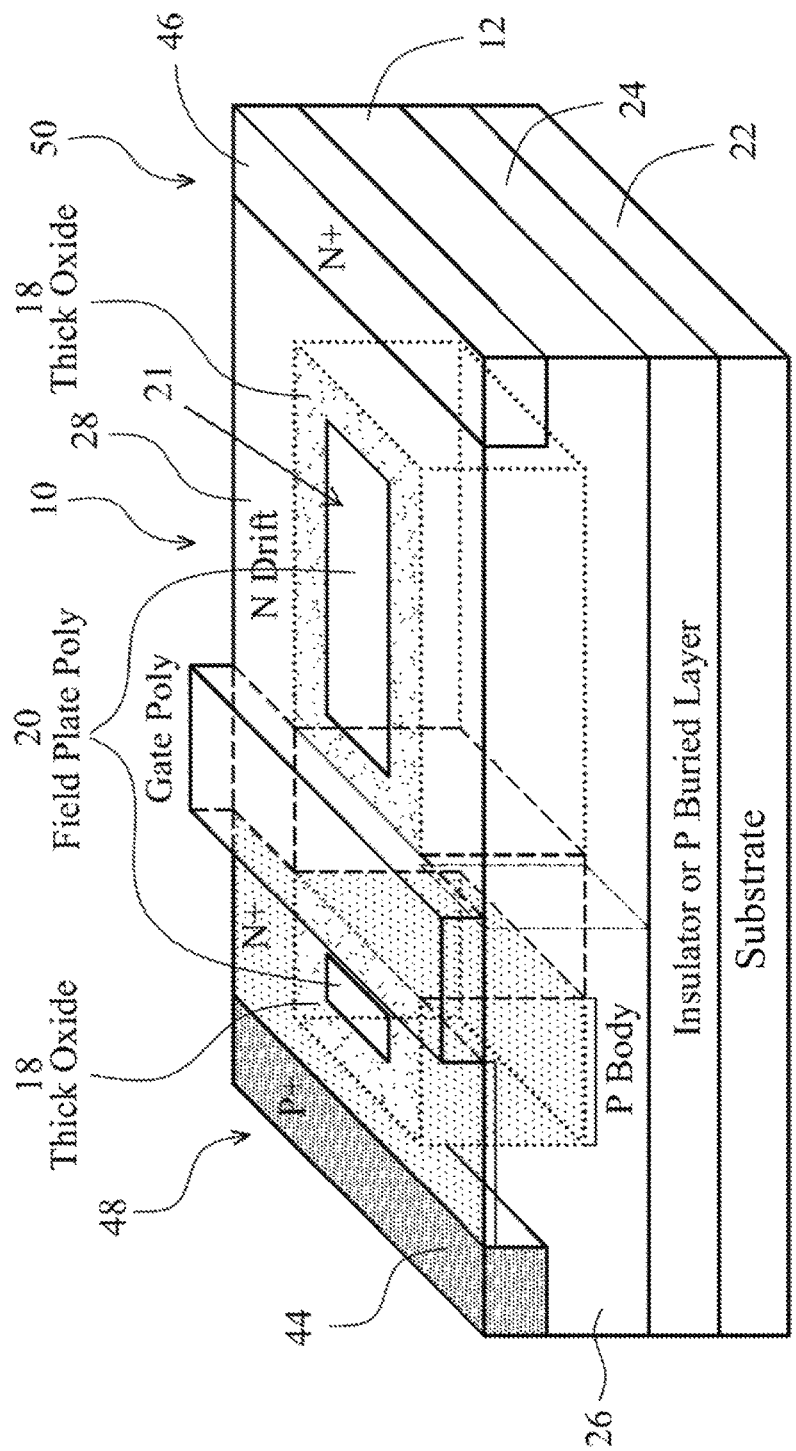

As shown in FIG. 9, a sixth masking process and a p-type implantation process are performed to complete the source 48 on the side of the gate 16 opposite the drain 50. Thereafter, a seventh masking process and metallization may take place. In addition, an eighth masking and a passivation process (not shown) may be performed to complete the formation of an embodiment FinFET device 10. It should be appreciated that other conventional or known semiconductor processing or fabrication steps, which have not been specifically described in detail herein for the sake of brevity, may be incorporated into or form part of the method of forming the FinFET device 10 schematically and collectively illustrated by FIGS. 4-9.

From the foregoing, it should be appreciated that the FinFET device 10 provides reduced channel and drift region resistances and reduced overall device specific on-resistance. The FinFET device 10 is also formed using a simplified process with a reduced mask count by using the same trench to form the source, the gate (a.k.a., the folded gate), and the field plate. In addition, several of the FinFET devices 10, each having a different breakdown voltage, may be fabricated on the same silicon by adjusting the length of the field plate and/or drift region. Moreover, the FinFET device 10 may be integrated with other devices on the same silicon.

In an embodiment, an integrated circuit device includes a pad layer having a body portion with a first doping type laterally adjacent to a drift region portion with a second doping type, a trench formed in the pad layer, the trench extending through an interface of the body portion and the drift region portion, a gate formed in the trench and over a top surface of the pad layer along the interface of the body portion and the drift region portion, an oxide formed in the trench on opposing sides of the gate, and a field plate embedded in the oxide on each of the opposing sides of the gate.

In an embodiment, an integrated circuit device includes a substrate, a pad layer supported by the substrate, the pad layer having a body portion with a first doping type laterally adjacent to a drift region portion with a second doping type, a trench formed in the pad layer, the trench extending through an interface of the body portion and the drift region portion, a gate formed in the trench and over a portion of the top surface of the pad layer, the gate extending along the interface of the body portion and the drift region portion, an oxide formed in the trench on opposing sides of the gate, and a field plate embedded in the oxide on each of the opposing sides of the gate.

In an embodiment, a method of forming a FinFET is provided. The method includes forming a trench in a pad layer having a body portion with a first doping type laterally adjacent to a drift region portion with a second doping type, the trench extending through an interface of the body portion and the drift region portion, forming a gate in the trench and over a top surface of the pad layer along the interface of the body portion and the drift region portion, depositing an oxide in the trench on opposing sides of the gate, and embedding a field plate in the oxide on each of the opposing sides of the gate.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device, comprising:
   a pad layer having a body portion with a first doping type laterally adjacent to a drift region portion with a second doping type;
   a gate over a top surface of the pad layer, the gate overlapping an interface between the body portion and the drift region portion, the gate extending into the pad layer;
   a dielectric material on opposing sides of the gate, the dielectric material extending to a bottom of the gate; and
   a first field plate embedded in the dielectric material on a first side of the gate, the dielectric material being interposed between the first field plate and the gate.

2. The integrated circuit device of claim 1, further comprising a second field plate embedded in the dielectric material on a second side of the gate, the first side being on an opposite side of the gate from the second side.

3. The integrated circuit device of claim 1, wherein the first field plate comprises polysilicon.

4. The integrated circuit device of claim 1, further comprising a first heavily-doped region in the body portion, the first heavily-doped region having the second doping type, the first heavily-doped region extending on opposing sides of the dielectric material.

5. The integrated circuit device of claim 4, further comprising a first source/drain region in the body portion, the first source/drain region having the first doping type, the first heavily-doped region being interposed between the first source/drain region and the dielectric material.

6. The integrated circuit device of claim 5, further comprising a second source/drain region in the drift region portion, the second source/drain region having the second doping type, the drift region portion being interposed between the second source/drain region and the dielectric material.

7. The integrated circuit device of claim 1, wherein the pad layer is over an insulating layer, wherein the dielectric material extends to the insulating layer.

8. An integrated circuit device, comprising:
   a substrate;
   a pad layer over the substrate, the pad layer having a body region with a first doping type laterally adjacent to a drift region with a second doping type;
   a gate overlapping the body region and the drift region, the gate extending into the pad layer;
   a first dielectric material between a first side of the gate and a portion of the drift region;
   a second dielectric material between a second side of the gate and a portion of the body region; and
   a first field plate embedded in the first dielectric material, wherein the first dielectric material is interposed between the first field plate and gate.

9. The integrated circuit device of claim 8, further comprising a second field plate embedded in the second dielectric material, wherein the second dielectric material is interposed between the second field plate and the gate.

10. The integrated circuit device of claim 8, further comprising a first source/drain region in the body region and a second source/drain region in the drift region.

11. The integrated circuit device of claim 10, wherein the first source/drain region has the first doping type, and the second source/drain region has the second doping type.

12. The integrated circuit device of claim 11, wherein the first source/drain region is separated from the second dielectric material by the body region.

13. The integrated circuit device of claim 11, wherein the second source/drain region is separated from the first dielectric material by the drift region.

14. The integrated circuit device of claim 8, wherein a thickness of the first field plate is less than a thickness of the pad layer.

15. An integrated circuit device, comprising:
   a body region having a first doping type;
   a drift region adjacent the body region, the drift region having a second doping type;
   a gate over a portion of a top surface of the body region and over a portion of a top surface of the drift region, the gate extending along a sidewall of the drift region and a sidewall of the body region;
   a first dielectric material interposed between the gate and the drift region;
   a second dielectric material interposed between the gate and the body region; and
   a first field plate in the first dielectric material.

16. The integrated circuit device of claim 15, further comprising a second field plate in the second dielectric material.

17. The integrated circuit device of claim 15, wherein upper surfaces of the first dielectric material, the second dielectric material and the first field plate are level.

18. The integrated circuit device of claim 15, wherein the first dielectric material extends completely through the drift region.

19. The integrated circuit device of claim 15, wherein the second dielectric material extends completely through the body region.

20. The integrated circuit device of claim 15, wherein the first field plate comprises a polysilicon material.

* * * * *